United States Patent
Bell et al.

(10) Patent No.: US 7,088,163 B1
(45) Date of Patent: Aug. 8, 2006

(54) CIRCUIT FOR MULTIPLEXING A TAPPED DIFFERENTIAL DELAY LINE TO A SINGLE OUTPUT

(75) Inventors: Marshall J. Bell, Chandler, AZ (US); James R. Kozisek, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 4 days.

(21) Appl. No.: 10/949,121

(22) Filed: Sep. 24, 2004

(51) Int. Cl.
H03H 11/26 (2006.01)

(52) U.S. Cl. ...................................... 327/271; 327/277

(58) Field of Classification Search ..................... None
See application file for complete search history.

(56) References Cited

U.S. PATENT DOCUMENTS

| | | | | |
|---|---|---|---|---|
| 5,179,303 A | * | 1/1993 | Searles et al. | 327/277 |
| 5,854,797 A | * | 12/1998 | Schwartz et al. | 714/724 |
| 6,073,259 A | * | 6/2000 | Sartschev et al. | 714/724 |
| 6,351,191 B1 | * | 2/2002 | Nair et al. | 331/57 |
| 6,677,791 B1 | * | 1/2004 | Okuda et al. | 327/158 |
| 6,756,818 B1 | * | 6/2004 | Liu et al. | 326/93 |
| 6,784,714 B1 | * | 8/2004 | Nakamura | 327/271 |
| 6,900,679 B1 | * | 5/2005 | Watarai | 327/158 |

\* cited by examiner

Primary Examiner—Timothy P. Callahan
Assistant Examiner—Cassandra Cox
(74) Attorney, Agent, or Firm—John W. Branch; Darby & Darby PC

(57) ABSTRACT

A method and circuit to adjust timing between received differential data and clock signals to compensate for differences between transmission paths of data and clock signals. According to one embodiment, a timing adjustment circuit includes a decoder, a differential delay stage and a converter stage. The decoder is arranged to select one of the differential tri-state buffers, which provides the signal with a selected delay to a differential-to-single-ended converter. The converter provides properly a timing-adjusted signal to other circuits for further processing. Two current sources may be employed instead of resistive loads for the converter stage resulting in increased operating frequency and decreased power dissipation.

18 Claims, 5 Drawing Sheets

CIRCUIT FOR MULTIPLEXING A TAPPED DIFFERENTIAL DELAY LINE TO A SINGLE OUTPUT

FIELD OF THE INVENTION

The present invention relates to timing adjustment circuits, and in particular, to a method and circuit for re-establishing proper timing between a clock signal and a data signal at a receiver circuit employing a differential delay line.

BACKGROUND

Historically, design engineers implementing high-speed interfaces have met numerous challenges in maintaining interface signal timing relationships and signal quality. Issues such as skew, jitter, crosstalk, and noise have been addressed through a combination of analog circuitry and board/chip physical design rules. Generally, analog circuitry has been used for signal conditioning, filtering, impedance matching, and noise suppression, while physical design rules have targeted skew and crosstalk minimization.

Various approaches have been tried for functional verification of uncertainty in edge placement, programmability of signal delay, and skew over a wide range of values, variable timing relationships between channels, and an ability to vary timing parameters across and outside of the valid range.

A common approach for compensating differences in transmission paths of clock and data signals is use of delay lines in conjunction with multiplexers. Instructions may be provided to a multiplexer for selecting appropriate amount of delay in a clock or a data signal from a tapped delay line. With the introduction of the appropriate amount of delay, proper timing may be re-established.

Thus, it is with respect to these considerations and others that the present invention has been made.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description of the Invention, which is to be read in association with the accompanying drawings, wherein.

DETAILED DESCRIPTION

Figure 1:
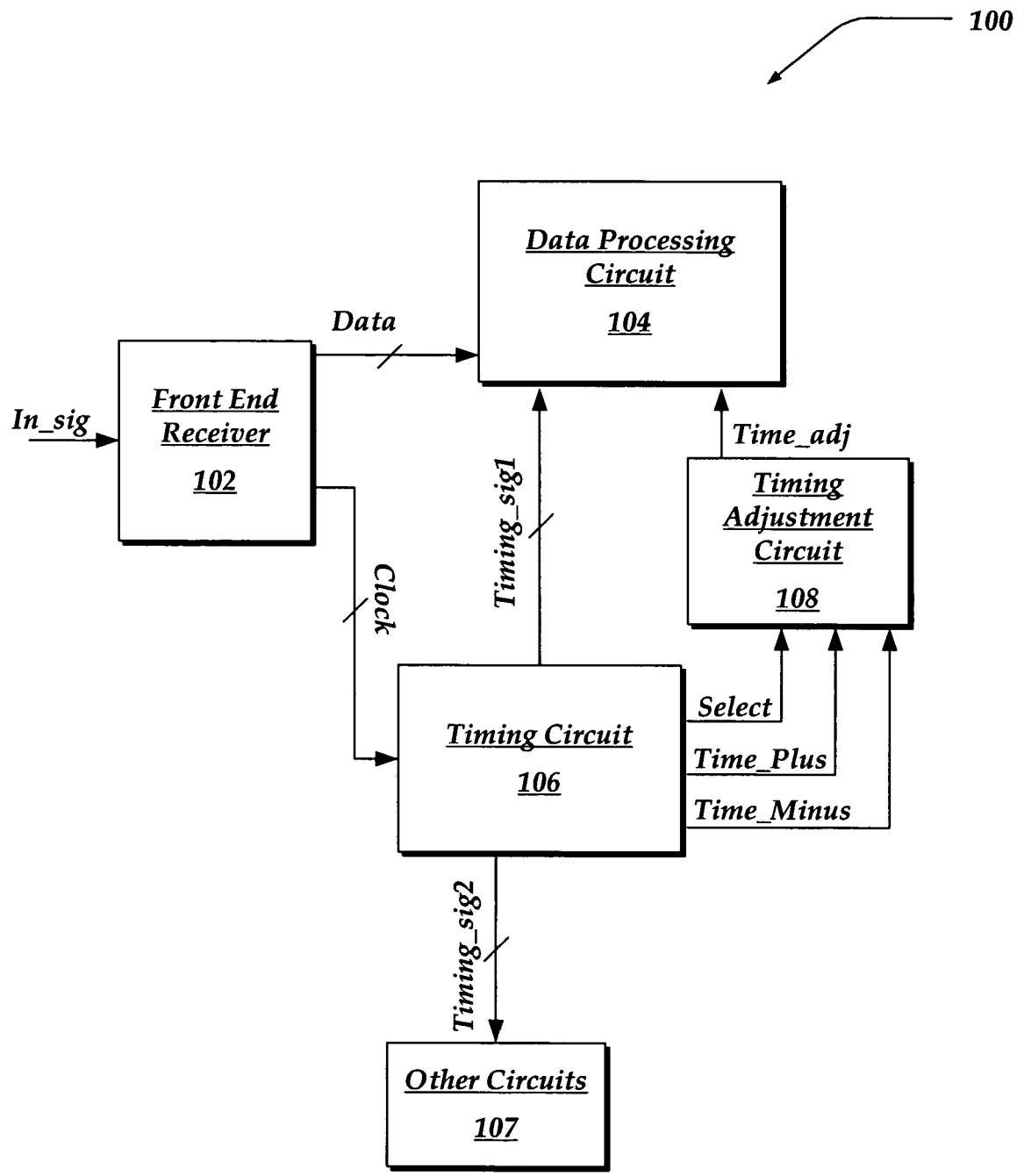
FIG. 1 is a block diagram partially illustrating a receiver device, in which one embodiment of the present invention may be implemented.

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment or an embodiment combining software and hardware aspects. The following detailed description is, therefore, not to be taken in a limiting sense.

Briefly stated, the present invention is directed to a method and circuit for adjusting timing between received differential data and clock signals to compensate for differences between transmission paths of data and clock signals.

Commonly, differential mode signals propagate through a pair of transmission paths. One transmission path carries one polarity of the signal, while the other transmission path carries an inverse polarity of the signal. Unlike single-ended signals, differential signals are referenced to themselves, which enables relatively more precise timing because a crossover point on a signal pair is easier to control than an absolute voltage to some other reference. Furthermore, higher speeds may be implemented with fewer drawbacks on differential signals because of easier timing controls. Moreover, noise and electromagnetic interference may be managed better in differential signals than in single-ended signals.

Additionally, employing one differential-to-single-ended converter instead of a plurality of such converters may reduce overall power consumption, because differential-to-single-ended converters tend to consume relatively higher amounts of supply current.

According to one aspect of the present invention, a timing adjustment circuit includes a decoder, a differential delay stage and a converter stage. The decoder is arranged to select one of the differential tri-state buffers, which provide the signal with a selected delay to a differential-to-single-ended converter. The differential-to-single-ended converter provides a timing-adjusted single-ended signal to other circuits for further processing. The differential-to-single-ended converter may comprise a high transconductance differential amplifier circuit that is arranged to reduce power consumption by the timing adjustment circuit. Two high impedance resistor circuits may operate as differential loads for the converter stage.

According to another aspect of the present invention, two current sources may be employed instead of the resistive loads for the converter stage resulting in increased operating frequency and further decreased power dissipation. The resistor circuits operating as differential loads and an impedance of the differential-to-single-ended converter together with parasitic capacitance of the circuit may act as a low-pass filter and limit an operating frequency of the timing adjustment circuit. Replacing the resistive loads with low impedance current sources and employing the low impedance differential-to-single-ended converter, essentially, increases a cut-off frequency of the low-pass filter, enabling the timing adjustment circuit to operate at higher frequencies.

FIG. 1 is a block diagram partially illustrating receiver device 100, in which one embodiment of the present invention may be implemented. Receiver device 100 includes front end receiver 102, data processing circuit 104, timing circuit 106, other circuits 107, and timing adjustment circuit 108.

Front end receiver 102 is arranged to receive input signal In_sig, and to provide data signal Data and timing signal Clock based on In_sig to data processing circuit 104 and to timing circuit 106, respectively. Front end receiver 102 may be further arranged to perform actions including filtering, amplifying, converting, and the like on the incoming signal. Data and Clock may include a plurality of data and clock signals, respectively, that may be provided in parallel or serial mode to data processing circuit 104. Data may further include the plurality of data signals, which are multiplexed in time domain, phase shifted, and the like.

Data processing circuit 104 is arranged to perform actions on incoming data signal Data based on predetermined design parameters. Data processing circuit 104 may include virtually any type of digital circuitry that is arranged to process Data. The processing may include filtering, translation, encoding, decoding, and the like.

Timing circuit 106 is arranged to provide various circuits of receiver device 100 with timing signals such as Timing_sig1 to data processing circuit 104, Timing_sig2 to other circuits 107, Time_Plus and Time_Minus to timing adjustment circuit 108, and the like. Timing_sig1 and Timing_sig2 may include a plurality of clock signals that are locally generated by timing circuit 106 independent of Clock or a subset of Clock, and provided for different functionalities of various circuits. For example, Timing_sig2 may include clock signals for comparators, flip flops, counters, and the like.

On the other hand, some circuits within receiver device 100, may employ a timing signal that is based on incoming clock signal Clock or a subset of Clock. Such circuits may include data serialization or deserialization circuits, sampling circuits, data analysis circuits, and the like. As described previously, clock and data components of In_sig received by front end receiver 102 may not be properly aligned due to differences in transmission paths of these components. Therefore, an adjustment of timing between the clock and data components may be performed by timing adjustment circuit 108 before delay-corrected timing signal Time_adj is provided to circuits such as data processing circuit 104.

Furthermore, in some cases, input signal In_sig may include differential data and/or clock signals. Timing circuit 106 may provide two halves of a differential clock signal such as Time_Plus and Time_Minus based on Clock to timing adjustment circuit 108. In one embodiment, Time_Plus and Time_Minus may be a subset of Clock. According to another embodiment of the present inventions, timing circuit 106 may also provide delay selection signal Select to timing adjustment circuit 108. Delay selection signal Select may be employed by timing adjustment circuit 108 for selection of a proper amount of delay as described below in conjunction with FIG. 2.

Timing adjustment circuit 108 is arranged to receive Time_Plus, Time_Minus, and Select provided by timing circuit 106, and to supply the delay-corrected timing signal Time_adj to data processing circuit 104. In one embodiment, timing adjustment circuit 108 may be arranged to process data signals instead of clock signals and adjust delays of various data signals included in Data.

FIG. 1 illustrates a particular arrangement of inputs and outputs of the various components. Other arrangements of the components may be implemented without departing from the scope and spirit of the present invention. The invention is also not limited to the above described examples.

Figure 2:
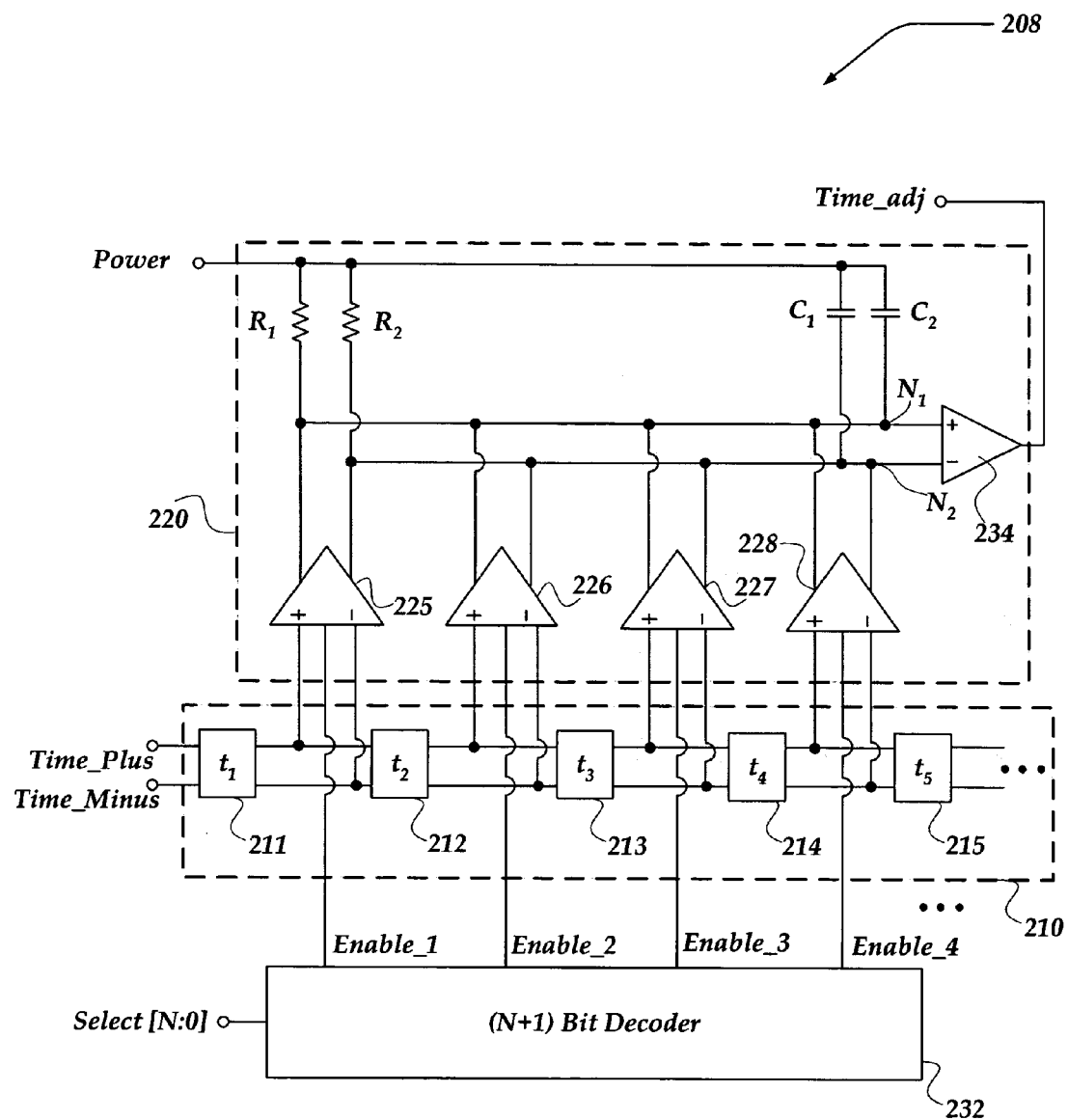
FIG. 2 schematically illustrates one embodiment of a timing adjustment circuit of FIG. 1 according to the present invention.

FIG. 2 schematically illustrates one embodiment of timing adjustment circuit 208. Timing adjustment circuit 208 is represents an N-element embodiment of timing adjustment circuit 108 of FIG. 1 according to the present invention. Timing adjustment circuit 208 includes decoder 232, differential delay stage 210, and converter stage 220. Differential delay stage 210 includes delay circuits 211–214. Converter stage 220 includes differential tri-state buffers 225–228, resistors $R_1$ and $R_2$, capacitors $C_1$ and $C_2$, and converter 234.

Differential delay stage 210 is arranged to receive two halves (Time_Plus and Time_Minus) of a differential signal, and to provide a predetermined number of delayed versions of Time_Plus and Time_Minus. In one embodiment, differential delay stage 210 comprises delay circuits 211–214, which are arranged to provide Time_Plus and Time_Minus with a substantially equal amount of delay at each delay circuit. Accordingly, outputs of delay circuits 211–214 provide Time_Plus and Time_Minus with incrementally increasing delays. For example, outputs of first delay circuit 211 may provide Time_Plus+50 milliseconds and Time_Minus+50 milliseconds; outputs of second delay circuit 212 may provide Time_Plus+100 milliseconds and Time_Minus+100 milliseconds; outputs of third delay circuit 213 may provide Time_Plus+150 milliseconds and Time_Minus+150 milliseconds; and the like.

In another embodiment, delay circuits 211–214 may be arranged to provide unequal amounts of delay such as logarithmically increasing, linearly increasing, and the like. Delay circuits 211–214 may include a tapped delay line, a transmission line based delay line, serially coupled buffer circuits, and the like.

Converter stage 220 is arranged to receive the predetermined number of delayed versions of differential input signals Time_Plus and Time_Minus, and to provide a single-ended output signal Time_adj based on a selection of one of the predetermined number of delayed versions of Time_Plus and Time_Minus. Converter stage 220 includes substantially the same number of differential tri-state buffers 225–228 as a number of delay taps in differential delay stage 210. Each differential tri-state buffer is arranged to receive a delayed version of Time_Plus and Time_Minus, and provide them to a common differential bus. The common differential bus is arranged to provide the signals to an inverting and a non-inverting input of differential-to-single-ended converter 234. Additionally, each differential tri-state buffer is arranged to receive an enable signal from decoder 232.

Decoder 232 is arranged to receive selection signal Select from timing circuit 106 and to determine which differential tri-state buffer is to operate employing a plurality of Enable signals. Timing circuit 106 may determine an appropriate amount of delay based on automatic testing of the transmission line, human input, feedback based on data analysis, and the like. Timing circuit 106 may then provide Select to timing adjustment circuit 208, which is used in decoder 232 to determine which delay circuit should be selected to provide the differential signal to converter stage 220. Decoder 232 accomplishes this by changing a level of one of the plurality of Enable signals for the selected delay circuit.

For example, if an amount of delay provided by delay circuits 211–213 is proper, decoder 232 may change the value of Enable_3 (change from low to high or from high to low) while keeping the other Enable signals substantially the same. An initial state for differential tri-state buffers 225–227 may be inactive. Accordingly, upon the change of a value of Enable_3, differential tri-state buffer 227 may become active and forward Time_Plus and Time_Minus with a corresponding amount of delay $(t_1+t_2+t_3)$ to the common differential bus.

If a different amount of delay if appropriate, another differential tri-state buffer may be selected by decoder 232 based on Select. The invention is not limited to the above described example, however. Virtually any amount of delay with any increments may be provided to the differential input signal.

Capacitors $C_1$ and $C_2$ represent parasitic capacitances in the circuit. Resistors $R_1$ and $R_2$ are arranged to provide a resistive load to the common differential bus. One potential drawback of using high impedance resistors as load may be an interaction between $R_1$ and $R_2$, and parasitic capacitors $C_1$ and $C_2$ resulting in a low pass filter effect that may reduce an operating frequency of the circuit.

FIG. 2 shows a particular arrangement of inputs and outputs of the various components. In one embodiment, all of the components of timing adjustment circuit 208 may be included in the same chip. Alternatively, one or more of the components may be off-chip.

Figure 3:
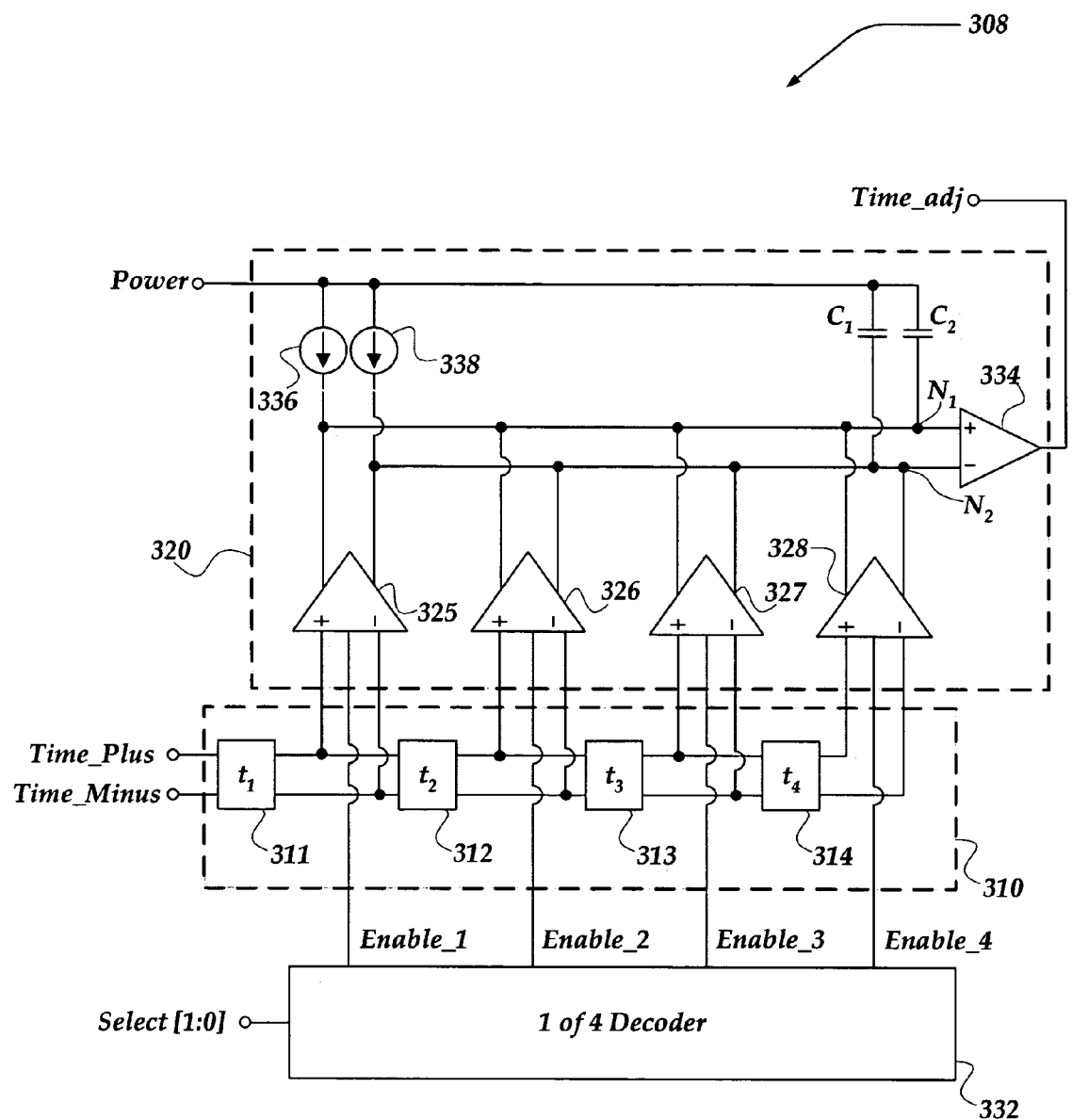
FIG. 3 schematically illustrates another embodiment of the timing adjustment circuit of FIG. 1.

FIG. 3 schematically illustrates one embodiment of timing adjustment circuit 308. Timing adjustment circuit 308 represents a four delay element example of timing adjustment circuit 108 of FIG. 1 according to the present invention. Timing adjustment circuit 308 includes decoder 332, differential delay stage 310, and converter stage 320. Differential delay stage 310 includes delay circuits 311–314. Converter stage 320 includes differential tri-state buffers 325–328, current sources 336 and 338, capacitors $C_1$ and $C_2$, and converter 334.

Delay circuits 311–314 of differential delay stage 310 and differential tri-state buffers 325–328 shown in FIG. 3 that are similarly named in FIG. 2 operate in substantially the same way as discussed above. Differential-to-single-ended converter 334 also operates substantially the same way as discussed in conjunction with FIG. 2.

Timing adjustment circuit 308 includes current sources 336 and 338, which replace high impedance load resistors $R_1$ and $R_2$ of timing adjustment circuit 208 of FIG. 2. As described previously, an interaction between $R_1$ and $R_2$, and parasitic capacitors $C_1$ and $C_2$ may result in a low pass filter effect that may reduce an operating frequency of the circuit. Current sources 336 and 338 together with a relatively low impedance of high transconductance converter 334 keep an impedance at the common differential bus substantially low, which results in a cut-off frequency of the low pass filter formed by parasitic capacitors $C_1$ and $C_2$ and the total impedance of the common differential bus being increased. Accordingly, an operating frequency of timing adjustment circuit 308 may be higher than timing adjustment circuit 208. Depending on an operating frequency need of different receiver devices either timing adjustment circuit may be implemented.

Moreover, a power dissipation due to high impedance of the common differential bus may be reduced by employing current sources 336 and 338 together with high transconductance converter 334.

Timing adjustment circuit 308 is arranged to enable a conversion of the differential input signal at a later stage than previous timing adjustment circuits. This may result in an increased immunity to electromagnetic noise coupling from other circuits through common mode injection, radiated coupling, and the like. Furthermore, by reducing a number of differential-to-single-ended converters in the timing adjustment circuit, overall power consumption due to sharp edge spikes that are generated by the converters may be reduced as well.

FIG. 3 shows a particular arrangement of inputs and outputs of the various components. In one embodiment, all of the components of timing adjustment circuit 308 may be included in the same chip. Alternatively, one or more of the components may be off-chip. Differential-to-single-ended converter 334 is discussed in more detail below in conjunction with FIG. 5.

Figure 4:
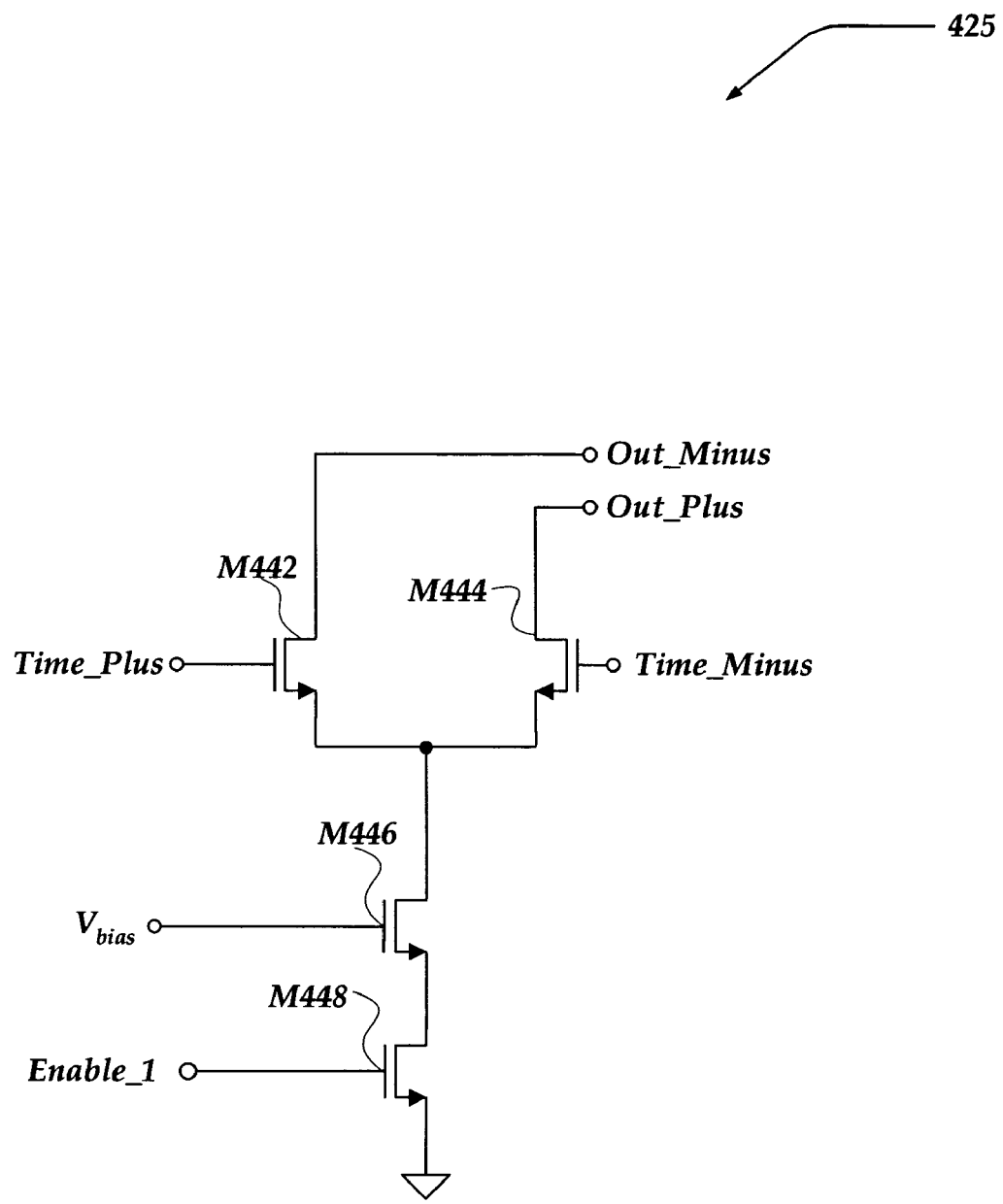
FIG. 4 schematically illustrates one embodiment of a tri-state differential buffer circuit of FIG. 3.

FIG. 4 schematically illustrates one embodiment of tri-state differential buffer circuit 425. Differential tri-state buffer circuit 425 represents one of differential tri-state buffer circuits 325–328 of FIG. 3. Differential tri-state buffer circuit 425 includes transistors M442, M444, M446, and M448.

While differential tri-state buffer circuit 425 is shown employing MOSFET transistors and references to MOSFET technology are made throughout the specification and claims, other technologies such as Bipolar Complementary Metal Oxide Semiconductor (BiCMOS), Heterojunction Bipolar Transistor (HBT), Metal Semiconductor Field Effect Transistor (MESFET), and Bipolar Junction Transistor (BJT) may also be implemented without departing from the scope or spirit of the invention.

Transistors M442 and M444 are arranged to operate as a differential amplifier and to provide differential output signal comprising Out_Minus and Out_Plus at their drain terminals based on Time_Plus and Time_Minus, which are provided to gate terminals of M442 and M444, respectively. Source terminals of M442 and M444 are coupled together to a drain terminal of biasing transistor M446. Bias voltage $V_{bias}$, which is provided to a gate terminal of M446, enables the differential amplifier comprising M442 and M444 to operate at a selected bias.

A source terminal of M446 is coupled to a drain of switch transistor M448. A source of M448 is coupled to a ground and an Enable_1 signal is provided to a gate terminal of M448. In one embodiment, Enable_1 may be provided by a delay selection circuit, such as decoder 332 of FIG. 3, and activate M448 based on a value of Enable_1. By activating and deactivating M448 based on Enable_1, the delay selection circuit may activate or deactivate differential tri-state buffer circuit 420.

As described previously, depending on which differential tri-state buffer circuit is selected an appropriate amount of delay may be introduced to input differential signals Time_Plus and Time_Minus by a delay stage, such as delay stage 310 of FIG. 3.

Figure 5:
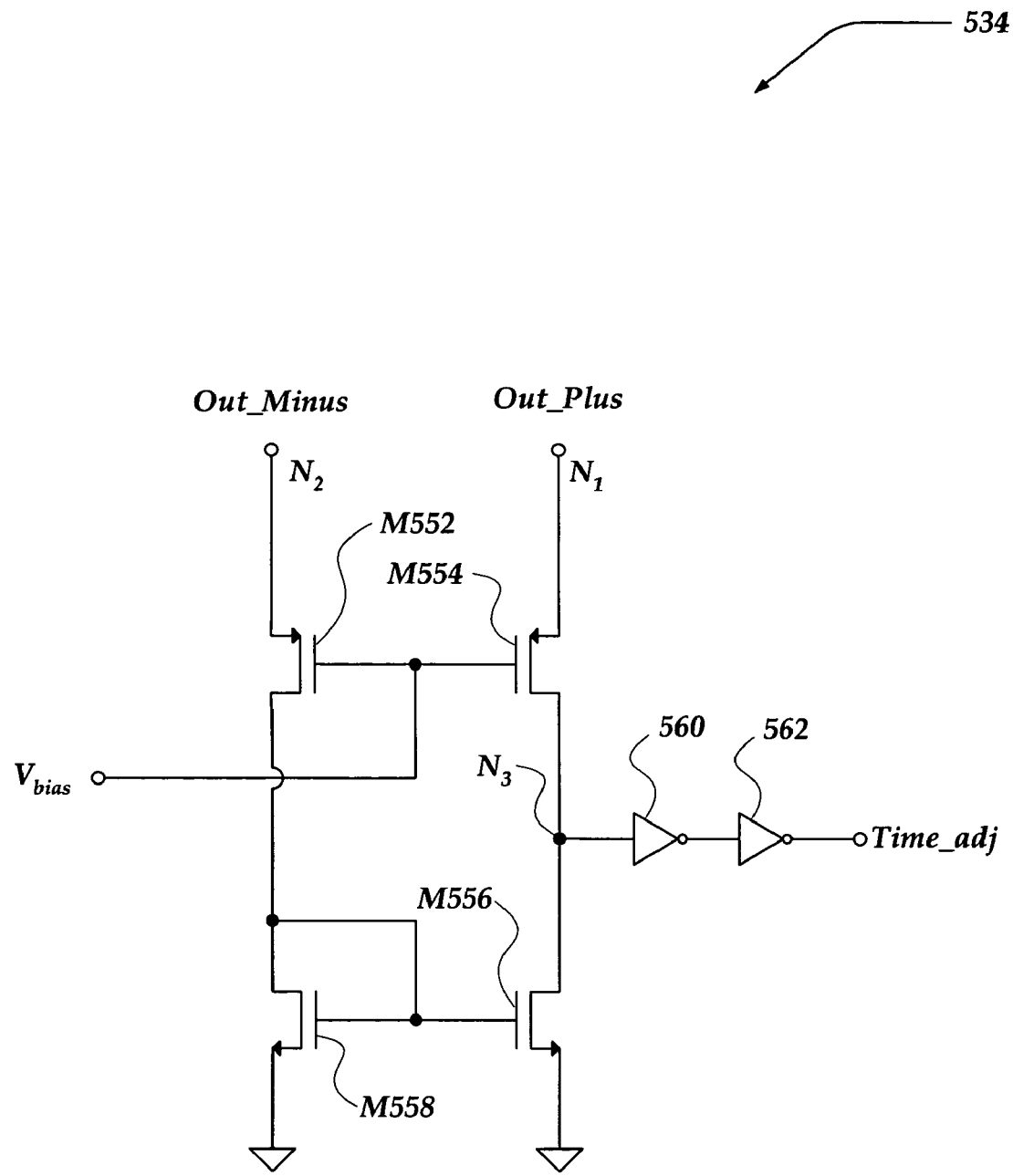
FIG. 5 schematically illustrates one embodiment of a differential converter circuit of FIG. 3.

FIG. 5 schematically illustrates one embodiment of differential-to-single-ended converter circuit 534. Differential-to-single-ended converter circuit 534 is one embodiment of converter 334 of FIG. 3. Differential-to-single-ended converter circuit 534 includes transistors M552, M554, M556, M558, and buffers 560 and 562.

While differential-to-single-ended converter circuit 534 is shown employing MOSFET devices, other technologies such as BiCMOS, HBT, MESFET and MOSFET may also be implemented without departing from the scope or spirit of the invention. A topology of differential-to-single-ended converter circuit 534, as shown in FIG. 5, may be referred to as "high transconductance converter".

PMOS transistors M552 and M554 are arranged to operate as a common-gate differential amplifier. Sources of M552 and M554 are arranged to receive two halves of a differential signal at nodes $N_1$ and $N_2$, such as a delayed version of Time_Plus and Time_Minus at $N_1$ and $N_2$ nodes of common differential us of timing adjustment circuit 308. Gate terminals of M552 and M554 are coupled together and arranged to receive bias voltage $V_{bias}$.

Transistors M556 and M558 are arranged to operate as a current mirror coupled between drain terminals of M552, M554, and a ground. Single-ended output signal Time_adj is provided at node $N_3$ at the drain terminal of M554.

In one embodiment, Time_adj may be a current and the circuit may include further components to convert the output current to a voltage. In this embodiment or another embodiment, two serially connected inverters 560 and 562 may also be coupled to node $N_3$ to provide output current stabilization and conversion of the output signal to a logic output value.

Differential-to-single-ended converter 534 is arranged to provide low impedance to the common differential bus. Accordingly, PMOS transistors M552 and M554 may be selected with high width-to-length ratios and biased at relatively high currents such that the converter is a high transconductance converter. In one embodiment, the width-to-length ratio may be at least 100.

The above specification, examples and data provide a description of the manufacture and use of the composition of the invention. Since many embodiments of the invention can be made without departing from the spirit and scope of the invention, the invention also resides in the claims hereinafter appended.

We claim:

1. A device for converting a differential signal to a single-ended signal with a predetermined delay, the device comprising:
   a delay circuit that is arranged to receive the differential input signal and to provide a plurality of delayed differential signals each having a predetermined amount of delay; and
   a converter circuit that is arranged to receive the plurality of delayed differential signals, to select one delayed differential signal from the plurality of signals, and to provide a single-ended output signal that is based on the selected delayed differential signal, wherein the converter circuit includes a plurality of differential tri-state buffer circuits and a differential-to-single-ended converter.

2. The device of claim 1, further comprising a decoder circuit that is arranged to enable one of the plurality of differential tri-state buffer circuits in response to a selection signal.

3. The device of claim 1, wherein the converter circuit further includes a common differential bus and at least two high impedance resistive load circuits between a power supply and the common differential bus, and, wherein the common differential bus is coupled to an inverting and a non-inverting input of the differential-to-single-ended converter.

4. The device of claim 3, wherein the differential-to-single-ended converter includes a high transconductance differential amplifier that comprises a first pair of low impedance transistors arranged to operate as a differential amplifier and a second pair of transistors that are arranged to operate as a current mirror coupled to drains of the first pair of transistors.

5. The device of claim 1, wherein the converter circuit further includes at least two current source circuits between a power supply and a common differential bus, and, wherein the common differential bus is coupled to an inverting and a non-inverting input of the differential-to-single-ended converter.

6. The device of claim 5, wherein the differential-to-single-ended converter includes a high transconductance differential amplifier that comprises:
   a first pair of low impedance transistors arranged to operate as a differential amplifier; and
   a second pair of transistors that are arranged to operate as a current mirror coupled to drains of the first pair of transistors.

7. The device of claim 6, wherein the differential-to-single-ended converter further includes a first inverter that is coupled to the drain of one of the first pair of transistors, and a second inverter that is serially coupled to the first inverter, and wherein the first inverter and the second inverter are arranged to convert an analog output signal to a digital output value.

8. The device of claim 6, wherein the first pair of transistors are configured to receive a bias voltage at their gate terminals.

9. The device of claim 2, wherein each of the plurality of differential tri-state buffer circuits comprises:
   a first transistor that is arranged to receive a first half of the delayed differential signal at a gate terminal and to provide a second half of an output differential signal at a drain terminal;
   a second transistor that is arranged to receive a second half of the delayed differential signal at a gate terminal and to provide a first half of the output differential signal at a drain terminal;
   a third transistor that is arranged to provide a bias voltage to drain terminals of the first transistor and the second transistor; and
   a fourth transistor that is arranged to activate the third transistor in response to an enable signal that is provided to a gate terminal of the fourth transistor.

10. A method for converting a differential signal to a single-ended signal with a predetermined delay, the method comprising:
    receiving a differential input signal;
    providing a plurality of delayed differential signals, wherein providing the plurality of delayed differential signals includes adding a plurality of delays to the differential input signal;
    selecting one of the plurality of delayed differential signals;
    converting the selected delayed differential signal to a single-ended signal employing a transconductance differential amplifier;
    providing the single-ended signal to a circuit for timing adjustment;
    receiving a selection signal;
    providing an enable signal to a conversion circuit based on the selection signal; and
    selecting one of the plurality of delayed differential signals based on the enable signal.

11. The method of claim 10, further comprising:
    converting the single-ended signal to a digital value.

12. The method of claim 10, further comprising:
    pre-selecting the transconductance differential amplifier to have a relatively high transconductance;
    employing a common differential bus to provide the selected delayed differential signal to the high transconductance differential amplifier; and
    providing supply currents to the common differential bus employing two current sources such that a total impedance of the common differential bus is substantially low.

13. The method of claim 12, further comprising:

pre-selecting the current sources and the high transconductance differential amplifier such that a cut-off frequency of a low-pass filter that is formed by the total impedance of the common differential bus and a parasitic capacitance is substantially high.

14. A device for converting a differential signal to a single-ended signal with a predetermined delay, the device comprising:

a delay circuit that is arranged to receive the differential input signal and to provide a plurality of delayed differential signals each having a predetermined amount of delay;

a converter circuit that is arranged to receive the plurality of delayed differential signals, to select one delayed differential signal from the plurality of signals, and to provide a single-ended output signal that is based on the selected delayed differential signal, wherein the converter circuit includes a low impedance common differential bus and a plurality of differential tri-state buffer circuits; and a decoder circuit that is arranged to enable one of the plurality of differential tri-state buffer circuits.

15. The device of claim 14, the converter circuit further includes:

two current sources that are arranged to provide supply currents to the low impedance common differential bus.

16. The device of claim 14, wherein the converter circuit further includes a high transconductance differential-to-single-ended converter that is arranged to receive the selected delayed differential signal and to provide a single-ended output signal in response to the selected delayed differential signal.

17. The device of claim 14, wherein the converter circuit further includes a plurality of differential tri-state buffer circuits that are arranged to provide the selected delayed differential signal to the common differential bus based on an enable signal from the decoder.

18. The device of claim 17, wherein the differential tri-state buffer circuits include at least one of a unity gain differential amplifier and a differential amplifier with a predetermined gain other than unity gain.

* * * * *